United States Patent
Wallace, Jr. et al.

(10) Patent No.: US 7,266,488 B1
(45) Date of Patent: Sep. 4, 2007

(54) PROGRAMMABLE PATTERN GENERATION FOR DYNAMIC BUS SIGNAL INTEGRITY ANALYSIS

(75) Inventors: Douglas E. Wallace, Jr., Austin, TX (US); Jonathan P. Dowling, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 791 days.

(21) Appl. No.: 10/379,977

(22) Filed: Mar. 5, 2003

(51) Int. Cl.
*G06F 17/50* (2006.01)
*G06F 7/60* (2006.01)
*G06F 7/48* (2006.01)
*G06F 9/45* (2006.01)

(52) U.S. Cl. .................. 703/14; 716/5; 716/6; 703/2; 703/3; 703/15; 703/16; 703/19; 703/22

(58) Field of Classification Search .................. 703/14
See application file for complete search history.

(56) References Cited

U.S. PATENT DOCUMENTS

| | | | | |
|---|---|---|---|---|
| 5,625,580 | A * | 4/1997 | Read et al. | 703/21 |
| 6,106,567 | A * | 8/2000 | Grobman et al. | 716/5 |
| 6,473,871 | B1 * | 10/2002 | Coyle et al. | 714/715 |
| 6,502,212 | B1 * | 12/2002 | Coyle et al. | 714/43 |
| 6,981,238 | B1 * | 12/2005 | Churchill | 716/15 |
| 2002/0188915 | A1 * | 12/2002 | Hayes | 716/4 |

OTHER PUBLICATIONS

Goyal et al., "Managing Signal Integrity" IEEE Spectrum 1994, p. 54-58.*
Cuny-R.H., "SPICE and IBIS Modeling Kits The Basis for Signal Integrity Analysis" 1996 IEEE p. 204-208.*
Lai et al., "Embedded-Software-Based Approach to Testing Crosstalk-Induced Faults at On-Chip Buses" IEEE 2001 p. 204-209.*

* cited by examiner

*Primary Examiner*—Anthony Knight
*Assistant Examiner*—Tom Stevens
(74) *Attorney, Agent, or Firm*—Zagorin O'Brien Graham LLP (57) ABSTRACT

A technique for performing signal integrity analysis of a system includes providing a stimulus pattern and a model of the system and performing analog simulation of the model utilizing the stimulus pattern. The stimulus pattern includes sequences of signal transitions with associated transition times and the sequences of signal transitions conform to a bus protocol and the associated transition times are according to characteristics of the system. The stimulus pattern is generated by initializing each of the sequences of signal transitions to an initial signal value and the associated transition times to an initial time, generating subsequent signal values and subsequent transition times by applying protocol rules and calculating timing adjustments for each of a list of transactions; the subsequent signal values and subsequent transition times to be added to the sequences of signal transitions.

41 Claims, 6 Drawing Sheets

| # VARIABLE | VARIABLE | |
| # NAME | VALUE | DESCRIPTION |
| --- | --- | --- |
| # ############## | ############# | ################################################################################## |
| BURST-LENGTH | 4 | #Valid entries are 4, 8, 16, 32, 64, 128, 256, 512, 1024 |
| RR-WAIT | 0 | #Valid entries are 0-10 in CK cycles. Can be in fractions. '0' implies one dead cycle between READ-READ bursts. |
| WR-WAIT | 0 | #Valid entries are 0-10 in CK cycles. Can be in fractions. '0' implies one dead cycle between WRITE-READ bursts. |
| RW-WAIT | 0 | #Valid entries are 0-10 in CK cycles. Can be in fractions. '0' implies one dead cycle between READ-WRITE bursts. |
| WW-WAIT | 0 | #Valid entries are 0-10 in CK cycles. Can be in fractions. '0' implies one dead cycle between WRITE-WRITE bursts. |
| DIMM-LIST | DIMM0-1 DIMM1-1 #DIMM2-2 #DIMM3-2 | #Describes DIMM number and number of banks per. Valid entries are DIMM[0,1,2,3]_[1,2] |
| TRANSFER-RATE | 533.3333 | #Valid entries are 400.0, 533.3333, 666.6666 (MT/s) |
| BURST-ORDER | R1 W0 | #Valid entries are R0-3 for 4-DIMM system and R0-1 for 2-DIMM system |
| WRITE-DQS-DIMM-DELAY | 1.00 1.25 1.50 1.75 | #Valid entries are in (ns). WRITE DQS delay. Two entries for 2-DIMM and four entries for 4-DIMM. |
| CK-DIMM-DELAY | 1.00 1.25 1.50 1.75 | #Valid entries are in (ns). CK delay. Two entries for 2-DIMM and four entries for 4-DIMM. |
| SEED | 3 | #Valid entries are 1-32K. Seeds generator for random functions. |
| ODD-BIT | 1 | #Valid range is 1-10. Defines odd-switching DQ bit. |
| USE-CK-DELAY | 1 | #'0' = CK-DQS skew is defined by CK delay and TDQSS. '1' = CK-DQS skew is calculated from CK and WRITE-DQS delay |
| TDQSS | -0.30 -0.10 0.10 0.30 | #Valid entries are in (ns). CK-DQS skew input to DRAM for WRITEs. Ranges from -0.350 to +0.350. |
| TDQSCK | -0.30 -0.10 0.10 0.30 | #Valid entries are in (ns). CK-DQS skew output from DRAM for READs. Ranges from -0.350 to +0.350. |
| TDQSQ | -0.30 -0.10 0.10 0.30 | #Valid entries are in (ns). DQ-DQS skew output from DRAM for READs. Ranges from -0.350 to +0.350. |
| CORE-DDRCLK-QUANT | 0.3 | #Valid entries are in (ns). CORECLK-DDRCLK granularity at cntroller. Affects WRITE DQ-DQS skew. Ranges-/+0.30. |
| ODT-MASK | 0 1 2 3 | #Valid entries are 0-1/0-3 for 2/4-DIMM system. Specifies DIMMs which have ODT disabled. -1 for no masking |
| DRAM-DRIVER-REF | D | #Appends this to DRAM driver reference. E.g. D1_-, D2_1, D2_1, D2_2. |
| DRAM-PIN-REF | 2 | #Explicit DRAM driver pin reference |
| ODT-DRIVER-REF | ODT_ | #Appends this to DRAM driver reference. E.g. ODT_D1_, ODT_D2_1, ODT_D2_1, ODT_D2_2 |
| ODT-PIN-REF | BI | #Explicit DRAM ODT pin reference |
| CTRL-DRIVER-REF | K8_ | #Appends this to controller driver reference. E.g. K8_1, K8_2 |
| CTRL-PIN-REF | BI | #Explicit controller driver pin reference |
| READ-DQS-CTRL-DELAY | 1.00 1.25 1.50 1.75 | #Valid entries are in (ns). READ DQS delay. Two entries for 2-DIMM and four entries for 4-DIMM. |
| DIMM-ODT-SKEW | 0.0 0.0 0.0 #-0.30 -0.10 0.10 0.30 | #Additional skew for DIMM ODT timing. (relative to CK-DIMM-DELAY) |
| CTRL-ODT-SKEW | 0.0 | #Additional skew for CTRL ODT timing. (relative to CK-DIMM-DELAY, READ-DQS-CTRL-DELAY, and TDQSCK) |
| NET_NAME | NET_1 NET_2 NET_3 NET_4 NET_5 NET_6 NET_7 NET_8 NET_9 NET_10 | |

FIG. 5

```
EVEN mode data with 1 starting bit #########

NET NET_4
NODE K8_4 BI (-1:Z,  17.81:H, 19.69:L, 21.56:H, 23.44:L, 25.31:Z, 562.5:Z)
NODE K8_ODT_4 BI (-1:L,  3.75:H, 18.13:L, 562.5:L)
NODE D1_4 2 (-1:Z)
NODE ODT_D1_4 BI (-1:L,  4.75:H, 17.88:L, 562.5:L)
NODE D2_4 2 (-1:Z,  8.75:H, 10.63:L, 12.5:H, 14.38:L, 16.25:Z, 562.5:Z)
NODE ODT_D2_4 BI (-1:L, 16.25:H, 29.38:L, 562.5:L)
ENDNET

NET NET_5
NODE K8_5 BI (-1:Z, 16.88:L, 18.75:H, 20.63:L, 22.5:H, 24.38:L, 26.25:Z, 562.5:Z)
NODE K8_ODT_5 BI (-1:L,  3.75:H, 18.13:L, 562.5:L)
NODE D1_5 2 (-1:Z)
NODE ODT_D1_5 BI (-1:L,  4.75:H, 17.88:L, 562.5:L)
NODE D2_5 2 (-1:Z,  5:L, 8.75:H, 10.63:L, 12.5:H, 14.38:L, 16.25:Z, 562.5:Z)
NODE ODT_D2_5 BI (-1:L, 16.25:H, 29.38:L, 562.5:L)
ENDNET

NET NET_6
NODE K8_6 BI (-1:Z, 16.88:H, 18.75:L, 20.63:H, 22.5:L, 24.38:H, 26.25:Z, 562.5:Z)
NODE K8_ODT_6 BI (-1:L,  3.75:H, 18.13:L, 562.5:L)
NODE D1_6 2 (-1:Z)
NODE ODT_D1_6 BI (-1:L,  4.75:H, 17.88:L, 562.5:L)
NODE D2_6 2 (-1:Z,  5:H, 8.75:L, 10.63:H, 12.5:L, 14.38:H, 16.25:Z, 562.5:Z)
NODE ODT_D2_6 BI (-1:L, 16.25:H, 29.38:L, 562.5:L)
ENDNET
```

FIG. 6

PROGRAMMABLE PATTERN GENERATION FOR DYNAMIC BUS SIGNAL INTEGRITY ANALYSIS

COMPUTER PROGRAM LISTING APPENDIX

Submitted with the application and incorporated by reference are two computer program listings stored on each of two duplicate compact disks (labeled COPY 1 and COPY 2). Each disk contains computer program listings in the C++ programming language which illustrate implementations of the invention. The listings are recorded as ASCII text in IBM PC/MS DOS compatible files which have the names, sizes (in kilo bytes) and creation dates listed below: ddrstimulator_header_functions.txt 4149 bytes (5 kb) Feb. 5, 2003 ddrstimulatorcode.txt 41,944 bytes (41 kb) Feb. 5, 2003

COPYRIGHT NOTICE

A portion of the disclosure of this patent document, including certain figures and the Computer Program Listing Appendix, contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

1. Field of the Invention

This invention relates to signal integrity analysis of a digital electronic circuit and more particularly to providing comprehensive stimulus for efficient signal integrity simulation of electronic circuits.

2. Description of the Related Art

In an integrated circuit design process, electronic circuits such as integrated circuit devices (ICs) are simulated to verify design accuracy. Stimulus patterns are provided at the inputs to the IC and the results are verified at the outputs of the IC. When designing a system, multiple ICs are connected together on a printed circuit board (PCB) via signal traces. Simulation of an electronic system, for example, a having large amounts of signal traces connecting multiple integrated circuit devices (ICs), is a complicated and time consuming process. Often, the characteristics of the signal traces are simply ignored or estimated with resistance-capacitance (RC) delay and the simulation of the electronic system focuses on the interaction of the outputs of the ICs. This treatment of signal traces in system simulation was acceptable in the past because clock speeds were slow and PCB population was not dense.

The signal integrity of signal traces has become increasingly important as digital signal rates in electronic systems have increased. At higher frequencies, PCB traces can no longer be treated as just wires used to connect ICs together. Instead, the PCB traces must be treated as radio frequency (RF) transmission lines. At high-speeds PCB traces, as well as connectors and IC packages, can make up a significant part of the overall signal delay. Even worse, interaction between signal traces can cause glitches, resets, logic errors, and other problems. Thus, verification of the correct functioning of high-speed digital hardware involves both digital design to verify proper operation of ICs and analog circuit design to verify proper operation of the signal traces between ICs.

Signal integrity analysis of network interconnections includes analyzing both transmission line effects such as ringing and reflections and interaction between signal traces, such as cross talk and simultaneously switching output (SSO) noise on the power planes. Signal characteristics can change over time due to these effects. Crosstalk between signals increases proportionally to the clock rate and can cause data dependent logic errors. Ground bounce and power supply noise increases with higher-powered drivers, increased switching rates, and parallel bus structures. Signal wave shape and propagation delay is also very important at high speeds. Careful consideration of these effects during the design process leads to robust system-level performance and reliability.

As system bus speeds increase, impedance matching on the interconnection network becomes more important. A greater percentage of PCB traces require termination. Terminators help control the signal wave shape on transmission lines. However, terminators occupy precious space on PCBs, and dissipate large amounts of power. More complex busses, such as double data rate (DDR-II) memory devices and advanced graphics port (AGP 8X) devices, implement active termination on-silicon in the I/O circuitry. On-silicon termination is dynamically controlled and saves PCB real estate. Timing associated with activation/de-activation of the dynamic termination circuitry must be carefully controlled in some applications.

Digital simulators have enabled logic design and verification for many years. However, digital simulators do not support analysis of analog characteristics such as transmission line effects and the interaction between PCB traces in a system. Analog simulators such as HSPICE can provide some analog analysis of signals, but provide results only as good as the input stimulus and noise model. For simple systems, where signal integrity is not an issue, delay can be roughly estimated as RC in nature and entered as an input into a logic simulator to model bus performance. For high speed digital systems, however, analog characteristics are not estimated, but rather should be included as part of the simulation to account for the complex interactions between bussed devices. Not only should the length and placement of signal traces be accounted for, but the complex signal transitions, for example, transitions related to bus protocol, on multiple signal traces should be simultaneously analyzed in a noise simulation model. Design cycles are short and the vast number of possible interactions between signal traces has typically made signal integrity analysis too expensive in time and labor to complete thoroughly. Signal integrity noise analysis performed with signal patterns that do not occur in the bus protocol run the risk of over-estimating signal integrity problems the system will experience in actual operation. Alternatively, to reduce signal integrity problems, system designers can place very strict routing and length requirements on signal traces and slow down bus interfaces or insert extra wait cycles to allow signals to settle between bus transactions.

If accurate signal integrity analysis were available prior to system production, improved PCB and I/O targets could be specified prior to design.

SUMMARY

Accordingly, in one embodiment, a technique for performing signal integrity analysis of a system includes providing a stimulus pattern and a model of the system and performing analog simulation of the model utilizing the stimulus pattern. The stimulus pattern includes sequences of signal transitions with associated transition times and the sequences of signal transitions conform to a bus protocol and the associated transition times are according to characteristics of the system.

In another embodiment, the stimulus pattern is generated by initializing each of the sequences of signal transitions to an initial signal value and the associated transition times to an initial time, generating subsequent signal values and subsequent transition times by applying protocol rules and calculating timing adjustments for each of a list of transactions; the subsequent signal values and subsequent transition times to be added to the sequences of signal transitions.

In another embodiment, the characteristics of the system include device population information.

In another embodiment, the bus protocol includes signal transition rules according to a bus transaction.

In another embodiment, the stimulus pattern includes a data pattern configured to analyze signal coupling in the system.

In another embodiment, the stimulus pattern includes signal timing based on signal loading in the system.

In another embodiment, the system includes control signals for active termination of signal traces.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

An automated software process to produce complex signaling scenarios for signal traces in a system is presented. The complex signaling scenarios include sequences of signal transitions according to bus protocols and system characteristics that can be used to perform signal integrity analysis. By producing complex signaling scenarios in a stimulus file, signal integrity analysis can be performed efficiently and comprehensively, allowing the design process to produce a more reliable and efficient system design. The ability to modify one or more input parameters, for example, a change in timing of the bus protocol, a desired pattern type, a signal timing adjustment, system configuration, and the like, is greatly simplified, thereby improving analysis time significantly. Signal integrity analysis can be used to improve PC board layout, determine necessary protocol timing, determine output driver strengths, determine necessary termination and timing for PCB traces, and the like.

By using actual bus protocol as excitation for the signal integrity noise model, over-estimation of signal degradation on the network is avoided. Careful modeling of network delay and signal integrity facilitates more accurate prediction of signal interaction during bus turn-around cycles. Further, the necessity of dead cycles for bus turn-around can be evaluated.

The automated software process reads one or more input files that define the desired stimulus to be generated. The input files can define different protocol rules, signal timing adjustments, and a transaction list. Protocol rules, for example, specify signal transitions per clock cycle that make up a particular bus transaction such as a read transaction. Signal timing adjustments identify timing deviations (from that specified in the protocol rules) for particular signals under specified conditions and include such parameters as the number of devices on the bus, transfer rate, and various timing delays (device to device propagation delays). A transaction list includes a set of desired transactions, for example, {read from device 0, write to device 3, write to device 2, . . . }. Such a transaction list can be quite large and include specific addresses and data patterns to write. The produced stimulus output includes pre-timed signaling for each signal based on the protocol of the bus, timing adjustments and transaction list.

The produced stimulus file can be converted to waveform plots to allow verification that the timing parameters are as desired, and to identify any obvious timing problems prior to signal integrity analysis. The produced stimulus file can be formatted for input into a signal integrity analysis tool such as XTK (Mentor), SPICE, or other simulation tools. Together with a system model that contains, for example, PC board layout and device population characteristics, the produced stimulus file can be utilized to perform detailed and accurate signal integrity analysis.

Figure 1:
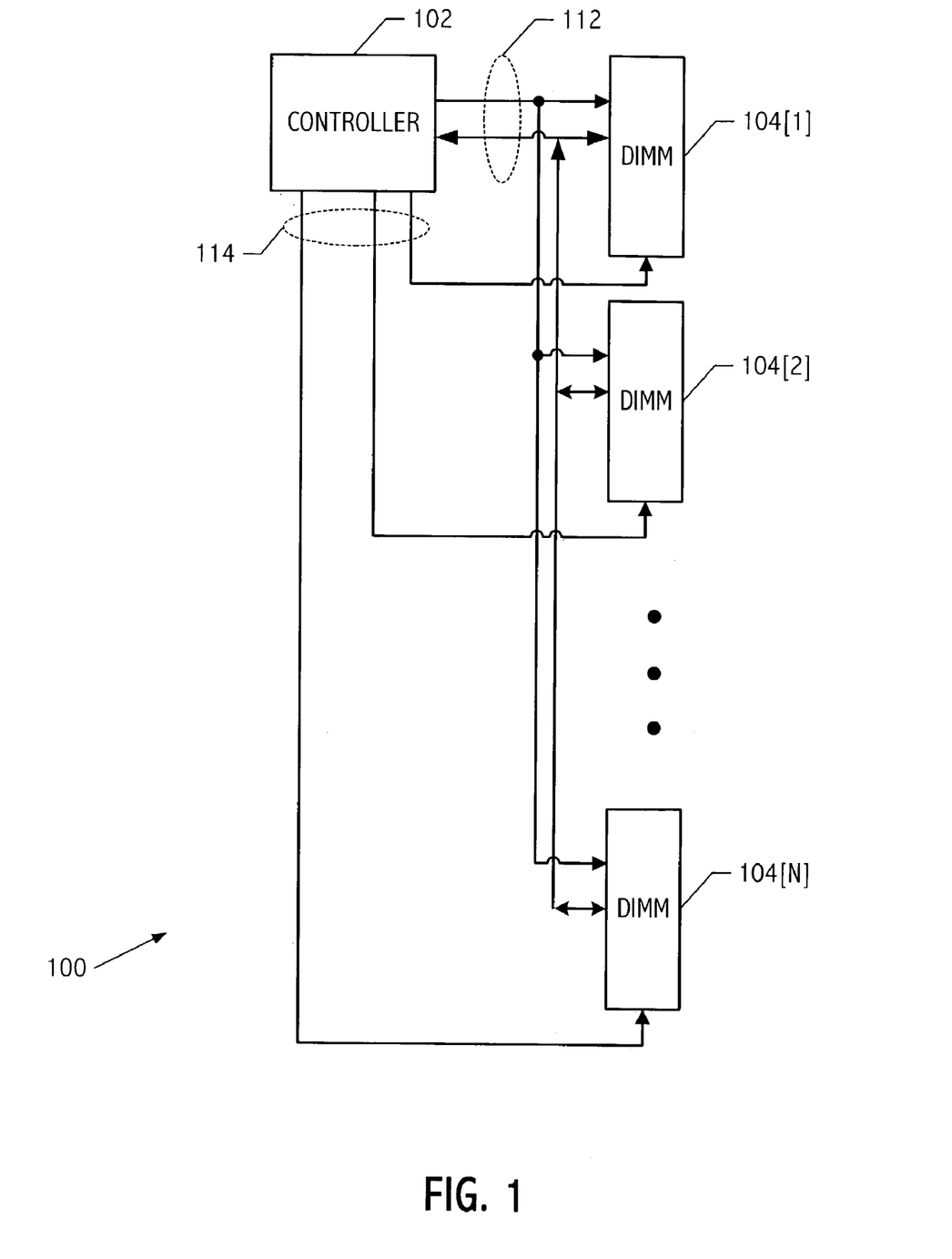
FIG. 1 illustrates an exemplary sub-system modeled and simulated using signal integrity analysis.

FIG. 1 illustrates an exemplary sub-system modeled and simulated using signal integrity analysis. A printed circuit board (PCB) 100 includes a controller 102 and multiple dual in-line memory modules (DIMMs) 104[1:N]. Controller 102 performs, for example, read and write transactions to DIMMs 104 via bus signals 112. Bus signals 112 include multiple control signals and data lines. In addition, controller 104 controls active termination of each of DIMMs 104 via termination control lines 114. Each of DIMMs 104 has a separate termination control line 114 such that termination for each of DIMMs 114 can be independently controlled.

In a typical design process, a software model of controller 102 and DIMMs 104 are simulated to verify design accuracy. Stimulus patterns are provided at the inputs to controller 102 which performs various bus transactions with DIMMs 104. Bus signals 112 are typically not modeled or simply assigned unit delays and the simulation of PCB 100 focuses on the interaction of controller 102 and DIMMs 104.

Bus signals 112 can have a large number of control signals and data lines having significant routing length. Thus, the layout of PCB 100 can be very dense. With increasing frequency of the interface between controller 102 and DIMMs 104, modeling of bus signals 112 can not be treated simply. To accurately simulate PCB 100 and increase system reliability, bus signals 112 are treated as radio frequency (RF) transmission lines. Bus signals 112, as well as any connectors and IC packages of controller 102 and DIMMs 104 make up a significant part of the overall signal delay. By modeling bus signals 112 as transmission lines, interaction between the signal traces can be understood such that glitches, resets, logic errors, and other problems can be avoided with proper PCB layout, changes in bus transaction timing, and the like.

DIMMs 104 provide active termination for bus signals 112 controlled by termination control lines 114. Termination on bus signals 112 help control ringing and overshoot by matching the transmission impedance of bus signals 112 so as to eliminate signal reflections from the physical ends of the bus. By modeling the termination of bus signals 112, termination control lines 114 can be carefully and precisely controlled for optimum performance. When performing a read to DIMM 104[1], the termination for DIMM 104[1] is turned off while the terminations for the other DIMMs 104 are turned on. When performing a write to DIMM 104[1], the termination for DIMM 104[1] is turned on while the terminations for the other DIMMs 104 are turned off. Precise timing of termination control lines 114 for optimum performance can vary based on the routing, for example, the length and interaction, of bus signals 112. In addition, the transaction protocol may need to be fine tuned (for example, the timing may require the insertion of one or more wait cycles between bus transactions).

Figure 2:
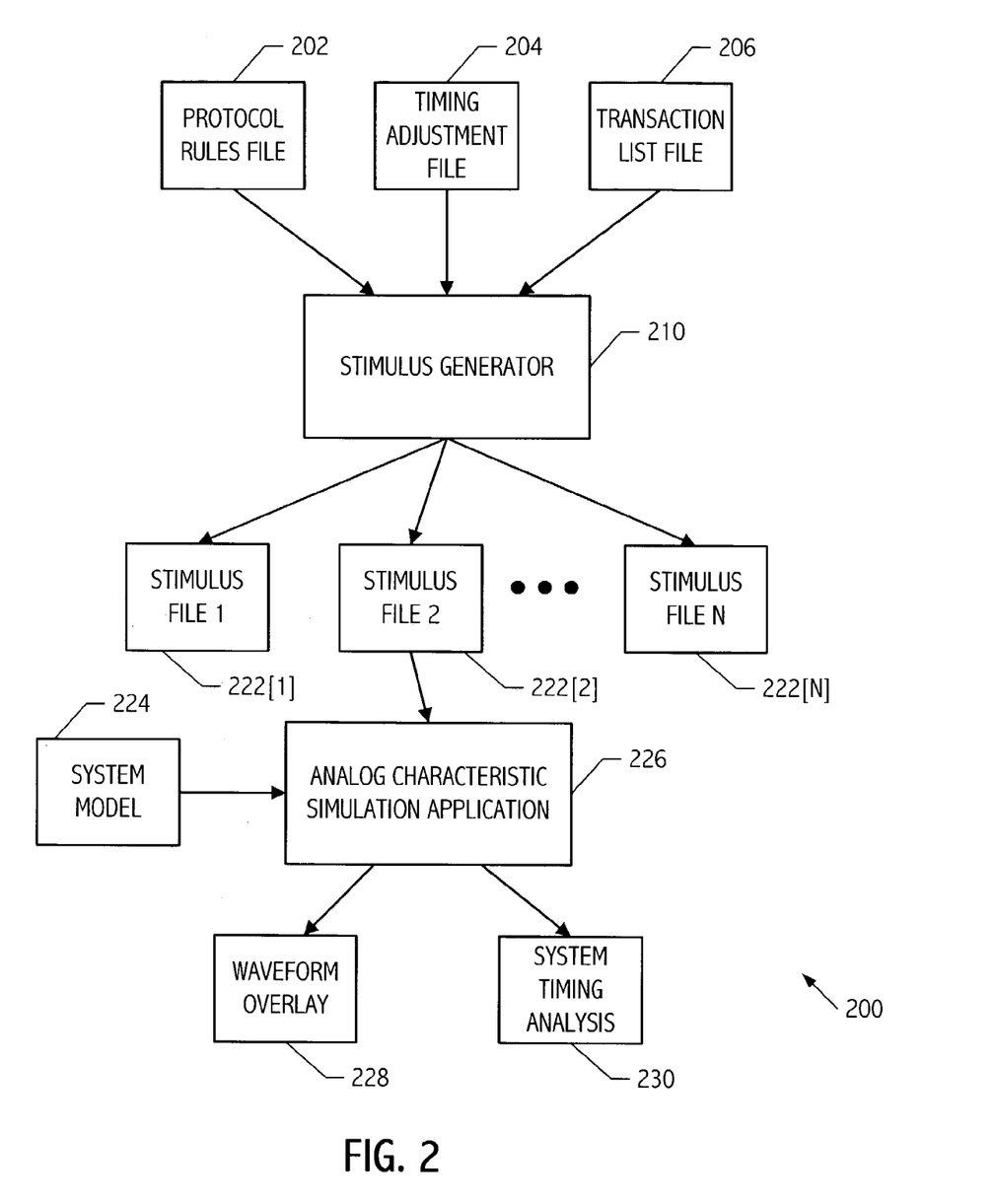
FIG. 2 illustrates an exemplary signal integrity analysis environment according to an embodiment of the present invention.

FIG. 2 illustrates an exemplary signal integrity analysis environment according to an embodiment of the present invention. A protocol rules file 202, a timing adjustment file 204 and a transaction list file 206 are parsed by a stimulus generator 210. Protocol rules file 202 defines bus transactions according to bus protocol. For example, protocol rule file 202 can specify the signal transitions of a particular bus transaction, for example, a memory read or write cycle. Protocol rules file 202 can also specify, for example, the number of cycles between a column address strobe (CAS) and a row address strobe (RAS) becoming active and the number of cycles between sequential transactions. Protocol rules file 202 can specify signal transitions based on, for example, clock edges or cycle numbers. Protocol rules file 202 can specify multiple transactions to be generated, for example, read, write, burst read, and the like and also identify data patterns and devices or addresses.

Timing adjustment file 204 specifies system characteristics, for example, a range of timing adjustments to signals and the number of devices on a bus. Timing adjustment file 204 can identify timing deviations (from that specified in the protocol rules) for particular signals under specified conditions and include such parameters as the number of devices on the bus, transfer rate, and various timing delays (device to device propagation delays). For example, under best case conditions, a signal can transition as early as 2 nanoseconds (ns) after a clock edge, or under worst case conditions, the signal can transition up to 6 ns after a clock edge. Many protocols specify acceptable ranges for signal timing. However, at high speeds and in high density systems, these ranges may be too lax or too strict and can be adjusted according to the results of signal integrity analysis.

Transaction list file 206 contains a sequence of transactions and data patterns for stimulus generator 210 to generate. A transaction list includes a set of desired transactions, for example, {read from device 0, write to device 3, write to device 2, . . . }. Such a transaction list can be quite large and include specific addresses and data patterns to write. Data patterns written or read from devices can have a significant and cumulative effect on signal integrity. For example, on a 16 bit bus, if all but one signal transitions from one to zero while the signal transitions from zero to one, coupling effects between the signal traces can degrade the integrity of the signal. In addition, accumulated noise can affect a signal's integrity over time.

Stimulus generator 210 reads these input files and produces one or more stimulus files 222[1:N]. In general, stimulus generator 210 applies protocol rules file 202 and timing adjustment file 204 and generates the stimulus output files 222 based on transaction list file 206. An exemplary processing performed by stimulus generator 210 is further described in relation to FIG. 3.

Stimulus files 222 are a series of files containing complex signal timing according to system configuration, transaction protocol and desired sequence of transactions and data patterns. Data patterns read or written to DIMMs 104, that is, the characteristics of the signal transitions on the data lines can include various data arrangements that affect signal interaction to be modeled. For example, the data patterns can be random, single bit patterns where all but one signal transitions to one or zero, and the like. By modeling different data patterns, complex signal interactions can be discovered through simulation of the systems analog characteristics. Because signal characteristics on transmission lines can vary over time and across differing signal transitions, detailed and complex signaling transitions need to be modeled.

Figure 6:
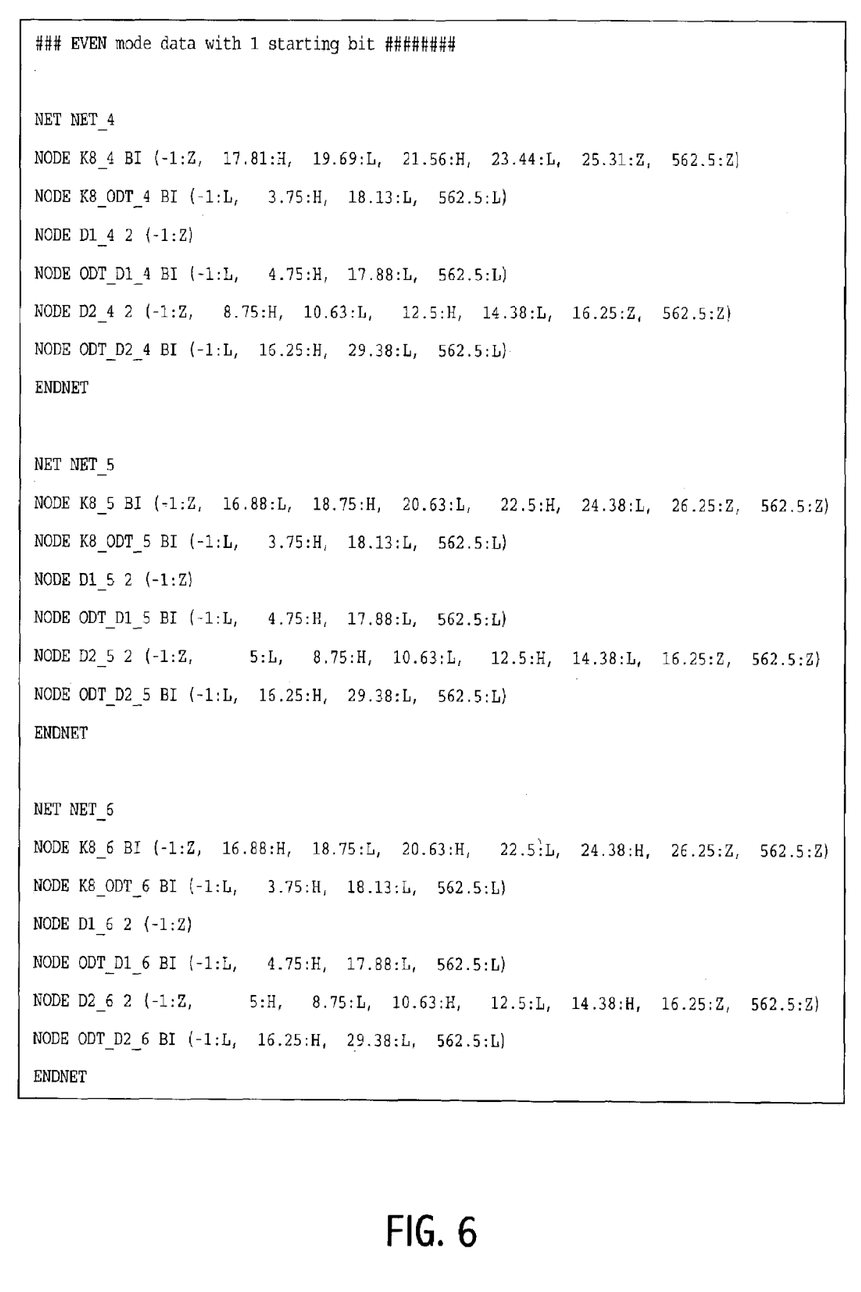
FIG. 6 illustrates an exemplary linked list output file generated according to an embodiment of the present invention.

Stimulus generator 210 can produce stimulus files 222 in a variety of formats, for example, a series of linked lists, one for each signal. The linked list describes a list of transitions for a signal over time and can include a signal name, a sequence of times and associated logic levels. An exemplary stimulus file in a linked list format is illustrated in FIG. 6. Linked lists may need to be converted to appropriate input format for analog characteristic simulation application 226.

A system model 224 and pattern files 222 are utilized by an analog characteristic simulation application 226 for signal integrity analysis. System model 224 includes such information as trace length and routing information of signal traces between devices in the modeled system. For example, in a system model of system 100, the length and routing characteristics of bus signals 112 and of termination control lines 114 to each of DIMMs 104 from controller 102 is provided. Thus, transmission line effects and coupling between signal traces can be analyzed. Analog characteristic simulation application 226 can be, for example, HSPICE or any other available analog simulator.

The results of the analog characteristic simulation can be analyzed using a waveform overlay 228 or a system timing analysis tool 230. Waveform overlay 228 graphically illustrates results of the simulation by overlaying multiple transitions of a signal forming, for example, an eye diagram. System timing analysis tool 230 illustrates statistically the results of the simulation. By reviewing the results of the simulation, timing requirements and necessary design changes can be found. Because protocol rules and a system model are used, the accuracy of the simulation results can be very high.

One or more input files can be parsed by stimulus generator 210. For example, the protocol rules can be built into stimulus generator 210 eliminating the need for a separate protocol rules file 202. Alternatively, the input information can be combined into one large input file parsed by stimulus generator 210.

In an alternate embodiment of the present invention, a graphical user interface (GUI) can be used to provide input to stimulus generator 210. For example, a user can input a desired transaction sequence or select a particular desired signal transition pattern to be generated. Additionally, a timing adjustment file or other particular input files can be selected using the GUI.

Figure 3:
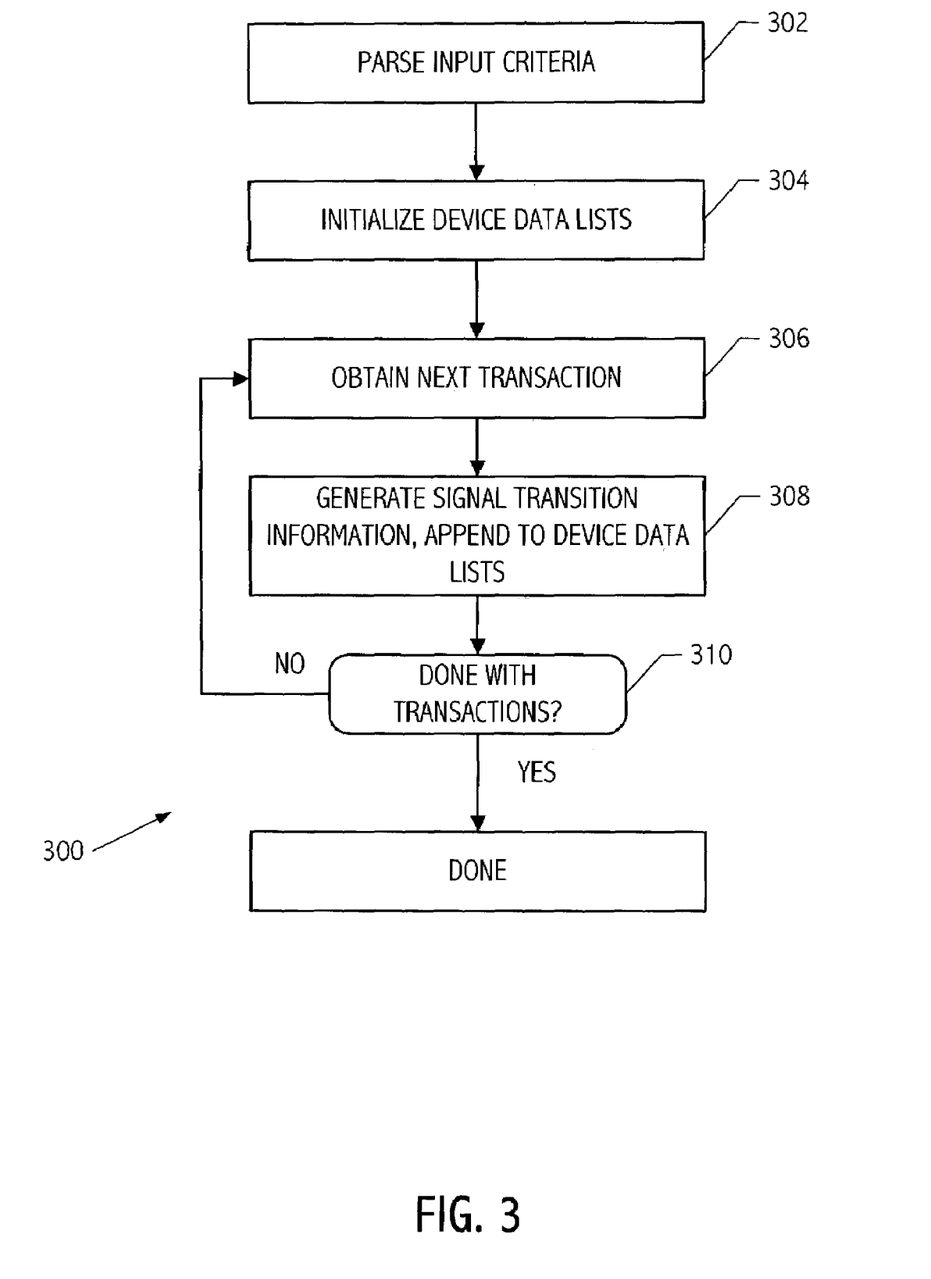
FIG. 3 illustrates a flow diagram of a stimulus generator according to an embodiment of the present invention.
Figure 4:
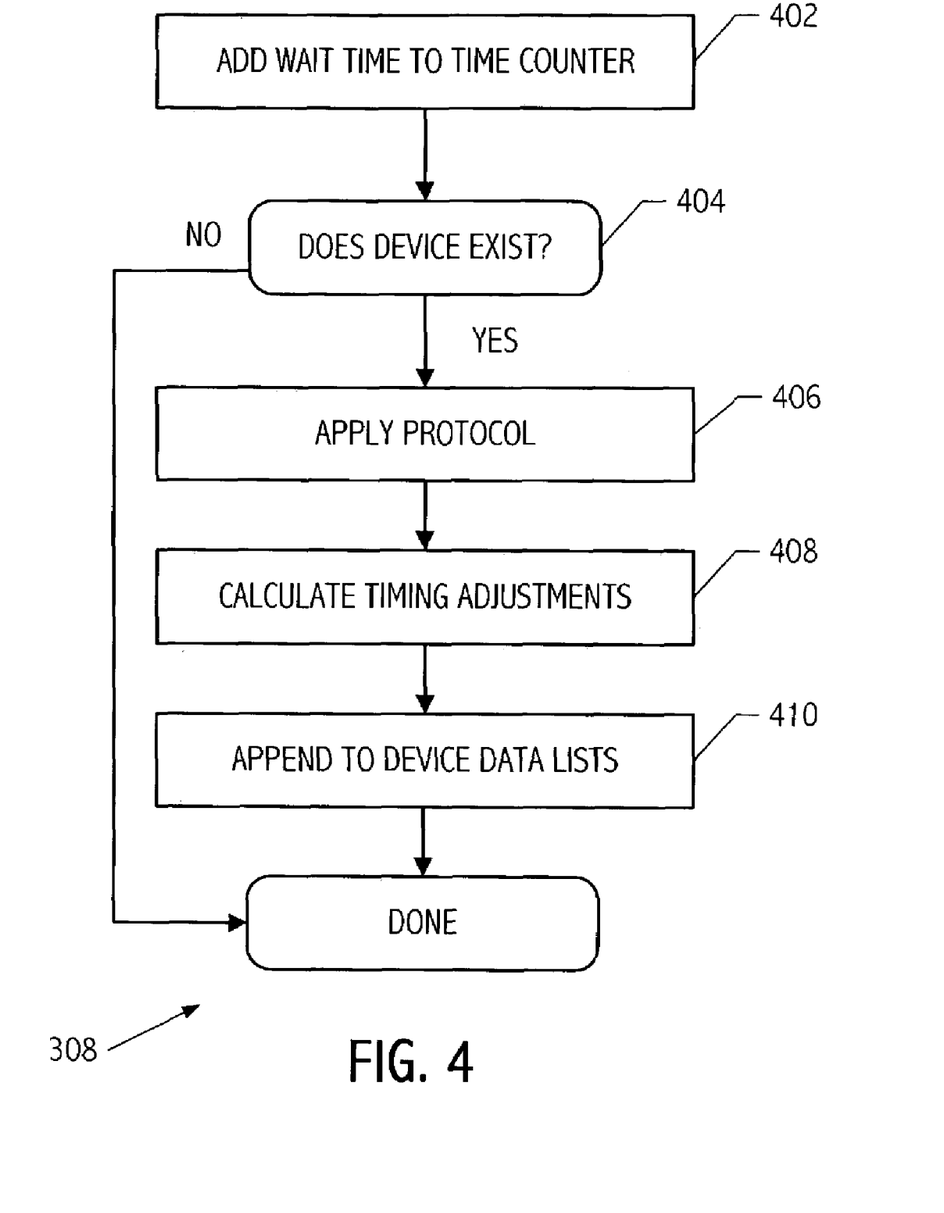
FIG. 4 illustrates another flow diagram of a stimulus generator according to an embodiment of the present invention.

FIG. 3 illustrates a flow diagram 300 of a stimulus generator according to an embodiment of the present invention. Input criteria is parsed by signal generator 210, step 302. For example, one or more input files such as protocol rules file 202, timing adjustment file 204, and transaction list file 206 are opened and read. Alternatively, a GUI is utilized to enter input criteria such as transaction sequence, timing or patterns desired or to select input files to be utilized. Device data lists are initialized, step 304. A device data list for each signal in a system to be simulated is generated with initial entries for each signal of an initial logic level and a start time. For example, each signal is initialized to a logic level of 0, 1, or 0.5 (tri-state) and time set to 0. Alternatively, each signal can be initialized to a voltage level. Completed device data lists contain, for example, a sequence of transitions described as logic or voltage levels and associated transition times. An exemplary device data list is illustrated in FIG. 6. A transaction is obtained from the sequence of transactions in transaction list file 206 or input through a GUI, step 306. Signal transition information including logic or voltage levels and associated transition timing is generated and appended to device data lists, step 308. For example, protocol rules are applied and timing adjustments are calculated according to the obtained transaction and system characteristics. An exemplary flow diagram of step 308 is illustrated in FIG. 4. A determination is made if there are any further transactions in the input sequence of transactions, step 310. If so, the next transaction is obtained, step 306. If not, stimulus generator 210 is complete and the device data lists contain appropriate signal transition information and timing according to protocol rules and system characteristics.

FIG. 4 illustrates an exemplary flow diagram of step 308 according to an embodiment of the present invention. Appropriate wait time is added to a time counter, step 402. Wait time is the specified time between transactions as set by the protocol rules. For example, the protocol rule can require two cycles of time between a read transaction and a subsequent write transaction. The time counter was initialized to an initial time, for example, 0, in step 304 of flow 300 and counts from the initial time up to the timing of the last transition of the last transaction in the sequence of transactions.

A determination is made whether the targeted device exists, step 404. This allows various system models to be simulated utilizing the same transaction list file 206. For example, input transaction list file 206 can contain reads and writes to 8 DIMM devices. A system having only 4 DIMM devices can be modeled and simulated utilizing transaction list file 206. If a write is targeted to DIMM 104[8], the system characteristics in the timing adjustment file 204 are checked to determine if DIMM 104[8] is populated. If the targeted device does not exist, step 308 is complete and the next transaction is obtained, step 306 of FIG. 3. If the device does exist, protocol rules are applied to the bus signals, step 406. For example, the protocol rule can specify when control signals and data lines transition. The protocol rules are generic and do not take into account loading on the bus, the number of devices in the system and the like. Next, timing adjustments are applied to the signals, step 408. Timing adjustments are calculated based on, for example, the number of devices in the system, incremental timing delays, and the like. Signal transition information according to the protocol rules and the timing adjustments is appended to the data lists, step 410. The flow is complete and returns to flow 300.

Figure 5:
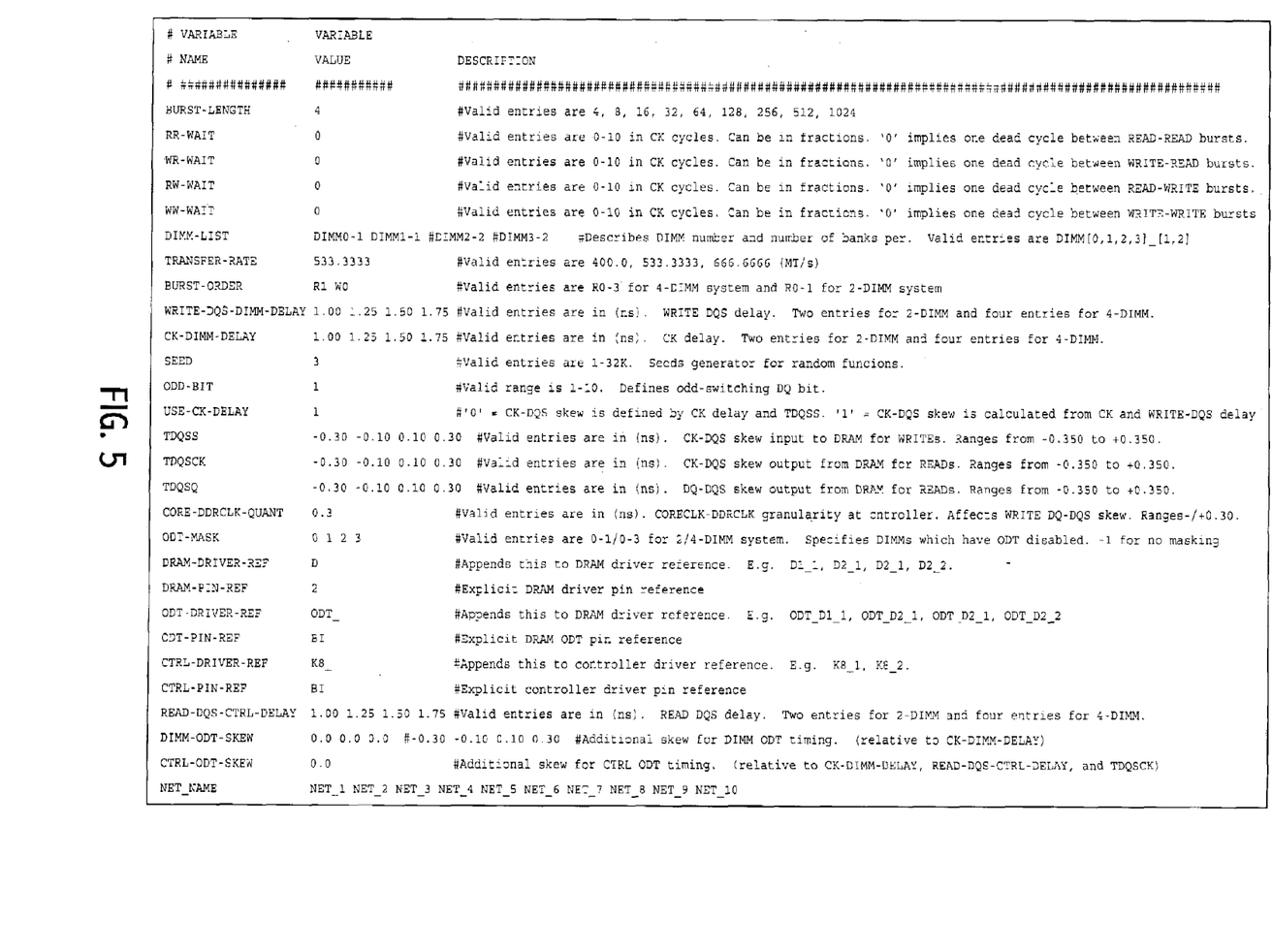
FIG. 5 illustrates an exemplary input file according to an embodiment of the present invention.

FIG. 5 illustrates an exemplary input timing adjustment file 204 according to an embodiment of the present invention. Timing adjustment file 204 contains a listing of variables and associated values used to calculate timing adjustments to the signal transitions defined according to protocol rules. The variables include protocol characteristics, system characteristics, and the like. Protocol characteristics include such items typically found in a device data sheet, for example, burst length, the number of wait cycles between transactions, bust order, transfer rate (cycle time), and signal skew ranges. System characteristics include, for example, populated device information, net names, and the like. The following table describes the variables in exemplary input timing adjustment file 204.

| | |
|---|---|
| BURST-LENGTH | Number of bit-times for individual READ/WRITE transactions |
| RR-WAIT | Wait-state for back-to-back READ transactions |
| WR-WAIT | Wait-state for back-to-back WRITE-to-READ transactions |
| RW-WAIT | Wait-state for back-to-back READ-to-WRITE transactions |
| WW-WAIT | Wait-state for back-to-back WRITE transactions |
| DIMM-LIST | Which DIMMs are populated and number of banks on each |
| TRANSFER-RATE | Bus frequency of operation |
| BURST-ORDER | Ordering of bus transactions. E.g. READ from DIMM0, then WRITE to DIMM2 |
| WRITE-DQS-DIMM-DELAY | Approximate delay for strobe (DQS) signal on WRITE cycle |
| CK-DIMM-DELAY | Approximate delay for propagation of CK from controller to DIMMs. This parameter is used to control ODT activation at the DRAMs |
| SEED | Seed for random number generator when tool writes out pseudo-random data patterns |
| ODD-BIT | Selection of data bit to drive opposite all other data bits |
| USE-CK-DELAY | WRITE cycle CK-DQS skew can be calculated in two different ways. This parameter selects one or the other |
| TDQSS | CK-DQS skew input to DRAM for WRITEs |
| TDQSCK | CK-DQS skew output from DRAMs during READs |
| TDQSQ | Data-Strobe skew output from DRAM during READs |
| CORE-DDRCLK-QUANT | Offset of DQS in DQ-eye at controller during WRITEs |
| ODT-MASK | Arbitrary disabling of ODT at one or more DIMMs |
| All variables ending in -REF | Formatting options for output stimulus files. Specific to each simulator |
| READ-DQS-CNTL-DELAY | Approximate DQS delay on READs. Used to determine controller ODT de-activation based on roundtrip looptime of CK-DQS return |
| DIMM-ODT SKEW | Arbitrary skew for DIMM ODT timing on per-DIMM basis |
| CNTL-ODT-SKEW | Arbitrary additional skew for controller ODT timing |

| | -continued |
|---|---|
| NET_NAME | Formatting option for names of 10 coupled nets in the noise model |

FIG. 6 illustrates an exemplary linked list file 222 according to an embodiment of the present invention. Linked list file 222 includes multiple device data lists. Each device in a system can have multiple signals and therefore multiple data lists. A data list is a data structure with a variable length list of points, each point having a time and a logic level or voltage value. Each data list is a series of transitions and associated transition times. Overall, linked list file 222 provides an accurate stimulation file according to protocol rules and timing adjustments that can be utilized to provide accurate and timely signal integrity analysis for a system.

Although PCB 100 and environment 200 are tailored to a memory subsystem, the present invention can equally apply to different systems, for example, a peripheral interconnect bus or a processor bus attached to multiple integrated circuits. Additionally, stimulus generator 210 can be tailored to any bus protocol or be a generic implementation that can utilize any bus protocol defined in protocol rules file 202.

Signal integrity simulation output from a design methodology employing the present invention is detailed and accurate. Generating signal integrity simulation stimulus is easy, thus saving design engineering time. Flexibility for wide signal integrity simulation coverage is implied with the increased efficiency.

Flows 300 and 308 are utilized for the generation of one or more stimulus patterns for signal integrity analysis according to some embodiments of the invention. It is appreciated that operations discussed herein may include directly entered commands by a computer system user, but the preferred embodiment includes steps executed by software modules. The functionality of step referred to herein may correspond to the functionality of modules or portions of modules. In addition to software modules, the above flows or portions of flows can be implemented as application instructions or menu items. For example, various input files can be selected or variables can be configured through the use of a GUI according to some embodiments of the present invention.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

Appended hereto is a Computer Program Listing Appendix containing source listings providing further description of an embodiment of the present invention. In particular, the source code listings demonstrate an implementation of a stimulus generator 210 implemented in C++ programming language for generating stimulus patterns for system 100. In this embodiment, protocol rules are built in to stimulus generator 210.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

The invention claimed is:

1. A method of performing signal integrity analysis of a system comprising:
   providing a stimulus pattern and a model of the system; and
   performing analog simulation of the model utilizing the stimulus pattern;
   wherein the stimulus pattern comprises sequences of signal transitions with associated transition times;
   wherein the sequences of signal transitions conform to a bus protocol and the associated transition times are according to characteristics of the system.

2. The method, as recited in claim 1, wherein the providing the stimulus pattern comprises:
   initializing each of the sequences of signal transitions to an initial signal value and the associated transition times to an initial time; and
   generating subsequent signal values and subsequent transition times by applying protocol rules and calculating timing adjustments for each of a list of transactions, the subsequent signal values and subsequent transition times to be added to the sequences of signal transitions.

3. The method, as recited in claim 1, wherein the characteristics of the system include device population information.

4. The method, as recited in claim 1, wherein the bus protocol includes signal transition rules according to a bus transaction.

5. The method, as recited in claim 1, wherein the stimulus pattern includes a data pattern configured to analyze signal coupling in the system.

6. The method, as recited in claim 1, wherein the stimulus pattern includes signal timing based on signal loading in the system.

7. The method, as recited in claim 1, wherein the system includes control signals for active termination of signal traces.

8. An integrated circuit device designed according to results obtained from the performing the analog simulation of the method of claim 1.

9. A system designed according to the method of claim 1.

10. A method comprising:
   generating a stimulus pattern; and
   utilizing the stimulus pattern to perform an analog simulation of a system,
   wherein generating the stimulus pattern comprises:
      initializing each of a plurality of sequences of signal transitions to an initial signal value and an initial transition time;
      generating subsequent signal values and subsequent transition times by applying protocol rules and calculating timing adjustments for each of a list of transactions; and
      appending the subsequent signal values and the subsequent transition times to the sequences of signal transitions.

11. The method, as recited in claim 10, wherein the timing adjustments are calculated according to device population information.

12. The method, as recited in claim 10, wherein the protocol rules include signal transition guidelines according to a bus transaction.

13. The method, as recited in claim 10, wherein the stimulus pattern includes a data pattern configured to analyze signal coupling in a system.

14. The method, as recited in claim 10, wherein the stimulus pattern includes signal timing based on signal loading in a system.

15. An integrated circuit device improved by the method of claim 10.

16. A system improved by the method of claim 10.

17. A computer program product for performing signal integrity analysis of a system comprising:
   a set of software instructions stored on computer readable media, the set of software instructions configured to:
      provide a stimulus pattern and a model of the system; and
      perform analog simulation of the model utilizing the stimulus pattern;
      wherein the stimulus pattern comprises sequences of signal transitions with associated transition times;
      wherein the sequences of signal transitions conform to a bus protocol and the associated transition times are according to characteristics of the system.

18. The computer program product, as recited in claim 17, wherein to provide the stimulus pattern, the set of software instructions is configured to:
   initialize each of the sequences of signal transitions to an initial signal value and the associated transition times to an initial time; and
   generate subsequent signal values and subsequent transition times by applying protocol rules and calculating timing adjustments for each of a list of transactions, the subsequent signal values and subsequent transition times to be added to the sequences of signal transitions.

19. The computer program product, as recited in claim 17, wherein the characteristics of the system include device population information.

20. The computer program product, as recited in claim 17, wherein the bus protocol includes signal transition rules according to a bus transaction.

21. The computer program product, as recited in claim 17, wherein the stimulus pattern includes a data pattern configured to analyze signal coupling in the system.

22. The computer program product, as recited in claim 17, wherein the stimulus pattern includes signal timing based on signal loading in the system.

23. The computer program product, as recited in claim 17, wherein the system includes control signals for active termination of signal traces.

24. A computer program product for generating a stimulus patter comprising:
   a set of software instructions stored on computer readable media, the set of software instructions configured to:
      initialize each of a plurality of sequences of signal transitions to an initial signal value and an initial transition time;
      generate subsequent signal values and subsequent transition times by applying protocol rules and calculating timing adjustments for each of a list of transactions; and
      append the subsequent signal values and the subsequent transition times to the sequences of signal transitions; and
   a second set of software instructions stored on computer readable media, the second set of software instructions configured to:
      utilize the stimulus pattern to perform an analog simulation of a system.

25. The computer program product, as recited in claim 24, wherein the timing adjustments are calculated according to device population information.

26. The computer program product, as recited in claim 24, wherein the protocol rules include signal transition guidelines according to a bus transaction.

27. The computer program product, as recited in claim 24, wherein the stimulus pattern includes a data pattern configured to analyze signal coupling in a system.

28. The computer program product, as recited in claim 24, wherein the stimulus pattern includes signal timing based on signal loading in a system.

29. An apparatus for performing signal integrity analysis of a system comprising:
   means for providing a stimulus pattern and a model of the system; and
   means for performing analog simulation of the model utilizing the stimulus pattern;
   wherein the stimulus pattern comprises sequences of signal transitions with associated transition times,
   wherein the sequences of signal transitions conform to a bus protocol and the associated transition times are according to characteristics of the system.

30. The apparatus, as recited in claim 29, wherein the means for providing the stimulus pattern comprises:
   means for initializing each of the sequences of signal transitions to an initial signal value and the associated transition times to an initial time; and
   means for generating subsequent signal values and subsequent transition times by applying protocol rules and calculating timing adjustments for each of a list of transactions, the subsequent signal values and subsequent transition times to be added to the sequences of signal transitions.

31. The apparatus, as recited in claim 29, wherein the characteristics of the system include device population information.

32. The apparatus, as recited in claim 29, wherein the bus protocol includes signal transition rules according to a bus transaction.

33. The apparatus, as cited in claim 29, wherein the stimulus pattern includes a data pattern configured to analyze signal coupling in the system.

34. The apparatus, as recited in claim 29, wherein the stimulus pattern includes signal timing based on signal loading in the system.

35. The apparatus, as recited in claim 29, wherein the system includes control signals for active termination of signal traces.

36. An apparatus comprising:
  means for generating a stimulus pattern comprising:
    means for initializing each of a plurality of sequences of signal transitions to an initial signal value and an initial transition time;
    means for generating subsequent signal values and subsequent transition times by applying protocol rules and calculating timing adjustments for each of a list of transactions;
    means for appending the subsequent signal values and the subsequent transition times to the sequences of signal transitions; and
  means for utilizing the stimulus pattern to perform an analog simulation of a system.

37. The apparatus, as recited in claim 36, wherein the timing adjustments are calculated according to device population information.

38. The apparatus, as recited in claim 36, wherein the protocol rules include signal transition guidelines according to a bus transaction.

39. The apparatus, as recited in claim 36, wherein the stimulus pattern includes a data pattern configured to analyze signal coupling in a system.

40. The apparatus, as recited in claim 36, wherein the stimulus pattern includes signal timing based on signal loading in a system.

41. The method, as recited in claim 1, wherein the analog simulation performance generates simulation results based, at least in part, on the model and the stimulus pattern.

* * * * *

UNITED STATES PATENT AND TRADEMARK OFFICE
CERTIFICATE OF CORRECTION

PATENT NO. : 7,266,488 B1  
APPLICATION NO. : 10/379977  
DATED : September 4, 2007  
INVENTOR(S) : Douglas E. Wallace, Jr. and Jonathan P. Dowling It is certified that error appears in the above-identified patent and that said Letters Patent is hereby corrected as shown below:

Col. 12, line 11, please replace "patter" with --pattern--

Signed and Sealed this

Twenty-fifth Day of December, 2007

JON W. DUDAS  
*Director of the United States Patent and Trademark Office*